US008647958B2

(12) United States Patent
Lee

(10) Patent No.: US 8,647,958 B2
(45) Date of Patent: Feb. 11, 2014

(54) METHOD FOR FABRICATING SEMICONDUCTOR DEVICE HAVING EXPANDED CRITICAL DIMENSION BY PERFORMINING SURFACE TREATMENT

(75) Inventor: Sang-Oh Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 340 days.

(21) Appl. No.: 12/832,187

(22) Filed: Jul. 8, 2010

(65) Prior Publication Data

US 2011/0294275 A1   Dec. 1, 2011

(30) Foreign Application Priority Data

May 31, 2010  (KR) .................. 10-2010-0051180

(51) Int. Cl.
  *H01L 21/20*  (2006.01)
(52) U.S. Cl.
  USPC .................................. 438/381; 438/672
(58) Field of Classification Search
  USPC ............ 438/381, 672; 257/E21.585, E21.008
  See application file for complete search history.

(56) References Cited

U.S. PATENT DOCUMENTS

| | | | | |
|---|---|---|---|---|
| 6,249,019 B1 * | 6/2001 | Sandhu et al. | ................ | 257/309 |
| 6,500,763 B2 * | 12/2002 | Kim et al. | ...................... | 438/689 |
| 6,511,878 B1 * | 1/2003 | Matsumura | .................... | 438/241 |
| 6,544,839 B1 * | 4/2003 | Kanamitsu et al. | ........... | 438/253 |
| 6,583,056 B2 * | 6/2003 | Yu et al. | ........................ | 438/639 |
| 7,101,769 B2 * | 9/2006 | Kim et al. | ...................... | 438/398 |
| 7,312,130 B2 * | 12/2007 | Kim et al. | ...................... | 438/397 |
| 7,629,218 B2 * | 12/2009 | Lee et al. | ...................... | 438/256 |
| 7,776,685 B2 * | 8/2010 | Ahn et al. | ...................... | 438/253 |
| 7,781,346 B2 * | 8/2010 | Park et al. | ..................... | 438/706 |
| 7,955,922 B2 * | 6/2011 | Nakabayashi et al. | ........ | 438/212 |
| 8,012,811 B2 * | 9/2011 | Chen et al. | .................... | 438/129 |
| 8,119,530 B2 * | 2/2012 | Hori et al. | ..................... | 438/694 |
| 8,168,542 B2 * | 5/2012 | Chen et al. | .................... | 438/694 |
| 8,309,469 B2 * | 11/2012 | Kajiwara | ...................... | 438/717 |
| 2005/0221513 A1 * | 10/2005 | Yue et al. | ........................ | 438/14 |
| 2006/0286745 A1 * | 12/2006 | Park et al. | ..................... | 438/255 |
| 2008/0102594 A1 * | 5/2008 | Kim et al. | ..................... | 438/381 |
| 2008/0206950 A1 * | 8/2008 | Bhat et al. | .................... | 438/397 |
| 2009/0291542 A1 * | 11/2009 | Song et al. | .................... | 438/381 |
| 2010/0112777 A1 * | 5/2010 | Lim et al. | ..................... | 438/399 |
| 2011/0065276 A1 * | 3/2011 | Ganguly et al. | ............. | 438/694 |

FOREIGN PATENT DOCUMENTS

| | | |
|---|---|---|
| KR | 1020070082206 | 8/2007 |
| KR | 1020090121003 | 11/2009 |

OTHER PUBLICATIONS

Notice of Allowance issued by the Korean Intellectual Property Office on Mar. 28, 2012.

* cited by examiner

*Primary Examiner* — Kimberly Rizkallah
*Assistant Examiner* — Caleb Henry
(74) *Attorney, Agent, or Firm* — IP & T Group LLP

(57) ABSTRACT

A method for fabricating a semiconductor device includes forming an isolation layer over a substrate, forming a plurality of open regions exposing the substrate by selectively etching the isolation layer, performing a surface treatment over the isolation layer, expanding the open regions by removing the surface-treated portion of the isolation layer, and forming a conductive layer in the expanded open regions.

9 Claims, 6 Drawing Sheets

METHOD FOR FABRICATING SEMICONDUCTOR DEVICE HAVING EXPANDED CRITICAL DIMENSION BY PERFORMINING SURFACE TREATMENT

CROSS-REFERENCE TO RELATED APPLICATION

The present application claims priority of Korean Patent Application No. 10-2010-0051180, filed on May 31, 2010, which is incorporated herein by reference in its entirety.

BACKGROUND OF THE INVENTION

Exemplary embodiments of the present invention relate to a technology for fabricating a semiconductor device, and more particularly, to a method for fabricating a storage node (SN) of a semiconductor device.

As the integration degree of semiconductor devices has increased, much research has been conducted to secure sufficient capacitance within a limited area. Accordingly, an SN is formed in a three-dimensional structure, for example, a cylindrical structure.

FIGS. 1A and 1B are cross-sectional views illustrating a conventional method for fabricating a semiconductor device.

Referring to FIG. 1A, an interlayer dielectric layer 12 is formed on a substrate 11 having a certain structure formed therein, and an SN contact plug 13 is formed through the interlayer dielectric layer 12. An etching stop layer 14 and an isolation layer 15 are formed on the interlayer dielectric layer 12. The isolation layer 15 and the etching stop layer 14 are selectively etched to form an open region 16 exposing the SN contact plug 13. The interlayer dielectric layer 12 and the isolation layer 15 may include an oxide layer, and the etching stop layer 14 may include a nitride layer.

Referring to FIG. 1B, an SN 17 is formed in the open region 16, and a wet dip-out process is performed to remove the isolation layer 15. Although not illustrated in FIG. 113, a dielectric layer and a plate electrode may be sequentially formed to complete a capacitor.

As the integration degree of the semiconductor devices increases, the critical dimension (CD) of the open region 16 in which the SN 17 is to be formed is continuously reduced. Accordingly, in the conventional method, it is difficult to secure a sufficient area in which the SN 17 is to be formed. As a result, the SN 17 may be formed abnormally.

To address such a concern, the isolation layer 15 at the side of the open region 16 may be additionally etched to expand the CD of the open region 16, after the open region 16 is formed. However, etching the isolation layer 15 at the side of the open region 16 by a predetermined thickness through a general etching process (dry etching or wet etching) is a very difficult process. Therefore, it is not easy to realize the etching. Furthermore, when the isolation layer 15 at the side of the open region 16 is etched, a bridge may easily occur between the adjacent open regions 16. Accordingly, the adjacent SNs 17 may be short-circuited.

SUMMARY OF THE INVENTION

An exemplary embodiment of the present invention is directed to a method for fabricating a semiconductor device, which is capable of stably expanding the CD of an open region.

In accordance with an exemplary embodiment of the present invention, a method for fabricating a semiconductor device includes forming an isolation layer over a substrate, forming a plurality of open regions exposing the substrate by selectively etching the isolation layer, performing a surface treatment over the isolation layer, expanding the open regions by removing the surface-treated portion of the isolation layer, and forming a conductive layer in the expanded open regions.

In accordance with another exemplary embodiment of the present invention, a method for fabricating a semiconductor layer includes: forming an interlayer dielectric layer having a plurality of storage node contact plugs, forming an isolation layer over the interlayer dielectric layer, forming a plurality of open regions exposing the respective storage node contact plugs by selectively etching the isolation layer, performing a surface treatment over the isolation layer, expanding the open regions by removing the surface-treated portion of the isolation layer, forming a storage node in each of the expanded open regions, and removing the isolation layer.

DESCRIPTION OF SPECIFIC EMBODIMENTS

Figure 1A:
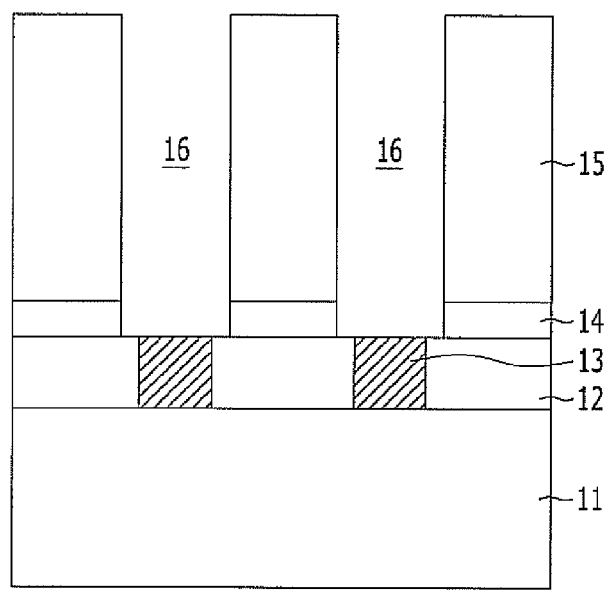
FIGS. 1A and 1B are cross-sectional views illustrating a conventional method for fabricating a semiconductor device.
Figure 1B:
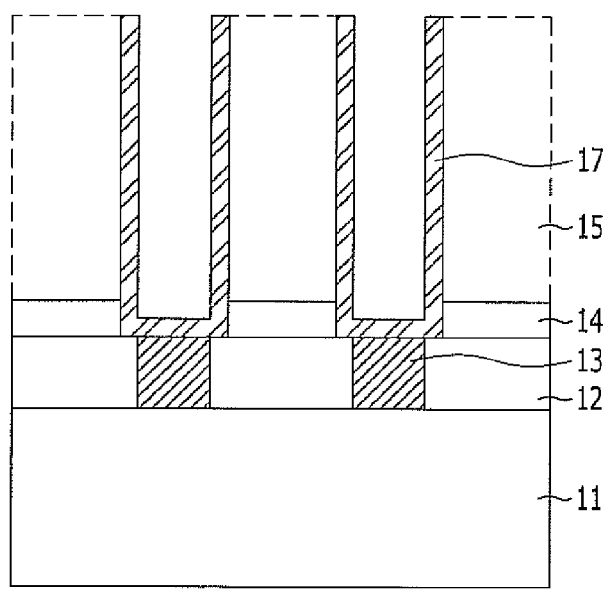

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Exemplary embodiments of the present invention provide a method for fabricating a semiconductor device, which is capable of stably expanding the critical dimension (CD) of an open region such as a storage node (SN) hole or contact hole of the semiconductor device. In order to achieve this, an isolation layer or interlayer dielectric layer which has been typically formed of an insulation layer, for example, an oxide layer is formed of a semiconductor layer, for example, a silicon layer. After the open region is formed, a surface treatment is performed on the semiconductor layer to stably expand the CD of the open region.

FIGS. 2A to 2F are cross-sectional views illustrating a method for fabricating a semiconductor device in accordance with an exemplary embodiment of the present invention. The method of FIGS. 2A to 2F in accordance with the embodiment of the present invention may be applied to a method for fabricating a capacitor of a semiconductor device.

Figure 2A:
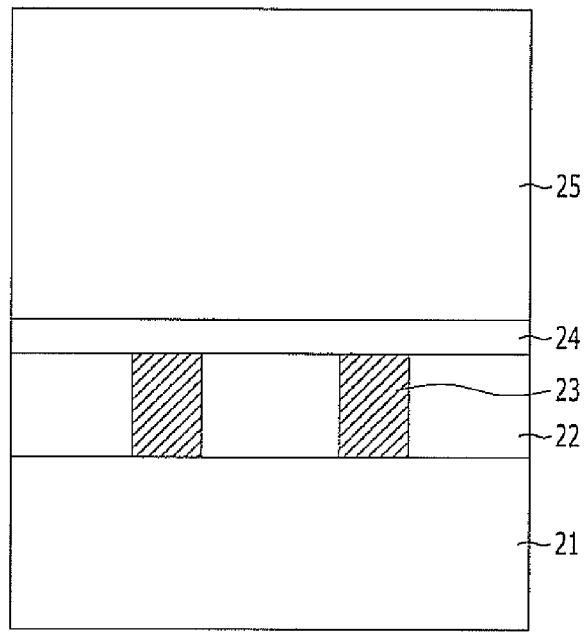
FIGS. 2A to 2F are cross-sectional views illustrating a method for fabricating a semiconductor device in accordance with an exemplary embodiment of the present invention.

Referring to FIG. 2A, an interlayer dielectric layer 22 is formed on a substrate 21 having structures formed therein, the structures including transistors, word lines, and bit lines. At this time, the interlayer dielectric layer 22 may include any one single layer selected from the group consisting of an oxide layer, a nitride layer, and an oxynitride layer or a multilayer in which the layers are stacked.

A plurality of SN contact plugs 23 are formed through the interlayer dielectric layer 22. The SN contact plugs 23 may include a silicon layer or a metallic layer formed of W, Ti, or TiN, or include a multilayer in which a metallic layer and a silicon layer are stacked. At this time, the SN contact plugs 23 may be formed of the same material as an isolation layer 25, in order to prevent SNs from collapsing during a subsequent wet dip-out process and increase the supporting force of the SNs.

An etching stop layer 24 and an isolation layer 25 are sequentially formed on the interlayer dielectric layer 22 having the SN contact plugs 23 formed therein. The isolation layer 25 is formed of a certain material so that a layer having an etching selectivity with respect to the isolation layer 25 can be formed through a subsequent surface treatment. In the exemplary embodiment of the present invention, the isolation layer 25 includes a semiconductor layer, for example, a silicon layer. Furthermore, the isolation layer 25 may be formed of SiGe or Ge.

The isolation layer 25 formed of a semiconductor layer may have a single crystalline phase, a polycrystalline phase, or an amorphous phase, depending on deposition conditions, for example, a deposition temperature. At this time, a semiconductor layer having an amorphous phase may be formed at a lower temperature than a semiconductor layer having a polycrystalline phase, and a semiconductor layer having a polycrystalline phase may be formed at a lower temperature than a semiconductor layer having a single crystalline phase. Therefore, in order to minimize a load, such as a heat load, which is applied to the formed structure while the isolation layer 25 is formed, the isolation layer 25 may be formed to have a polycrystalline phase or amorphous phase. Accordingly, when the isolation layer 25 is formed of a silicon layer, a polysilicon layer or amorphous silicon layer may be used. For reference, since the polysilicon layer or amorphous silicon layer is typically formed at a temperature of 600° C. or less, it may be easily applied as the isolation layer 25. Furthermore, the amorphous silicon layer is formed at a lower deposition temperature than the polysilicon layer. Therefore, when the isolation layer 25 is formed of an amorphous silicon layer, it is possible to significantly reduce a heat load for the formed structure.

The etching stop layer 24 is formed of a material having an etching selectivity with respect to the isolation layer 25, the interlayer dielectric layer 22, and a certain material layer which is to be formed through a subsequent surface treatment. For example, the etching stop layer 24 may be formed of nitride.

Meanwhile, the interlayer dielectric layer 22 formed of an insulation material and the isolation layer 25 formed of a silicon layer have an etching selectivity with respect to each other. Therefore, if necessary, the process of forming the etching stop layer 24 may be omitted. For reference, since the interlayer insulation layer 12 and the isolation layer 15 are formed of the same material in the conventional method, the etching stop layer 14 should be formed.

Figure 2B:
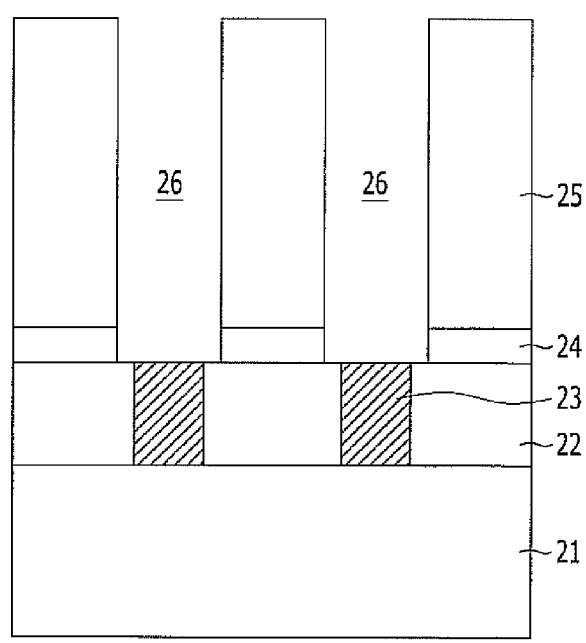

Referring to FIG. 2B, a hard mask pattern (not shown) is formed on the isolation layer 25, and the isolation layer 25 and the etching stop layer 24 are sequentially etched using the hard mask pattern as an etching barrier so as to form a plurality of open regions 26 exposing the respective SN contact plugs 23.

The etching process for forming the open regions 26 may be performed as follows. First, a gas mixture in which HBr and $Cl_2$ are mixed is used to etch the isolation layer 25 until the etching stop layer 24 is exposed. Continuously, a gas mixture in which $CHF_3$ and $CF_4$ are mixed is used to etch the etching stop layer 24 until the SN contact plugs 23 are exposed.

Figure 2C:
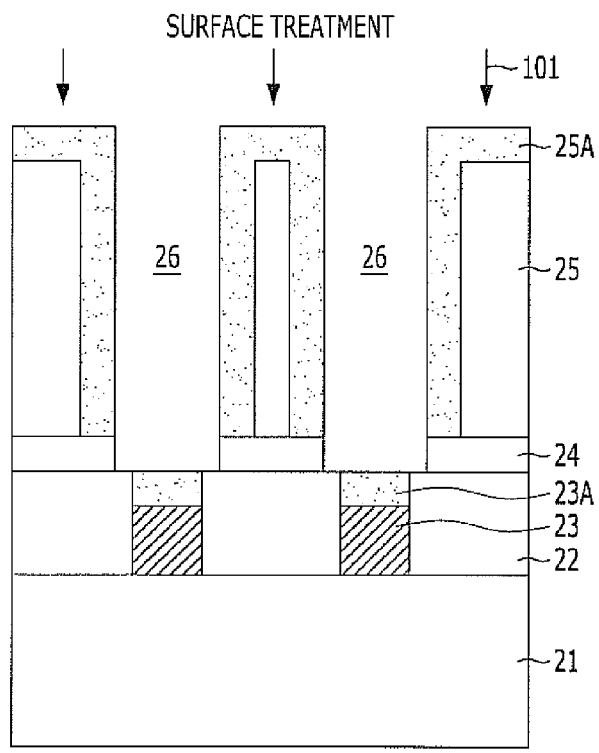
Figure 2D:
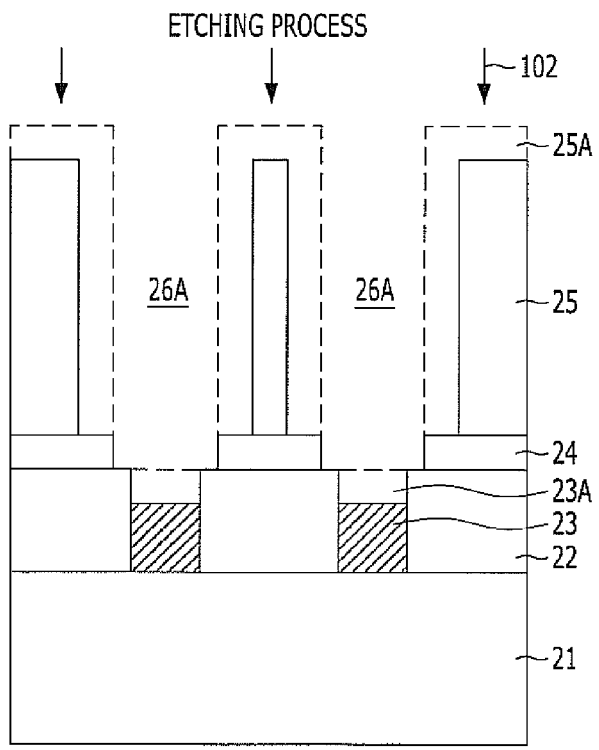

Referring to FIG. 2C, a surface treatment 101 is performed on the isolation layer 25 and the SN contact plugs 23 which are exposed. At this time, the surface treatment 101 may be performed by using any one process selected from the group consisting of oxidation, nitration, and oxynitrocarburising processes. Furthermore, each of the oxidation, nitration, and oxynitrocarburising processes may be performed by using any one or more treatments selected from the group consisting of a thermal treatment, a plasma treatment, and a radical treatment. For example, any one of the thermal treatment, the plasma treatment, and the radical treatment may be used to perform the thermal treatment 101, or the thermal treatment and the plasma treatment are simultaneously used to perform the surface treatment 101. Hereafter, a case in which the oxidation process is used to perform the surface treatment 101 is described as an example.

The surface treatment 101 using the oxidation process may be performed by using any one of a thermal treatment in a gas atmosphere containing oxygen, a plasma treatment using reactive oxygen ions generated by using gas containing oxygen, and a radical treatment using oxygen radicals generated by using gas containing oxygen. When the surface treatment 101 using the oxidation process is performed on the isolation layer 25, a portion of the isolation layer 25 is transformed into an oxide layer 25A, for example, a silicon oxide layer, while the surface of the isolation layer 25 is oxidized. Due to the characteristic of the oxidation process, the oxide layer 25A formed on the surface of the isolation layer 25 may have a constant thickness along the entire surface of the isolation layer 25. This is because reactants in a gas state, an ion state, or a radical state are uniformly contacted with the surface of the structure having the open regions 26 formed therein, and the oxide layer 25A is formed through the reaction between the reactants and the isolation layer 25. For reference, even when the surface treatment 101 is performed by the nitration or oxynitrocarburising process, a nitride layer or oxynitride layer is formed with a constant thickness along the surface of the isolation layer 25.

Meanwhile, when the SN contact plugs 23 are formed of the same material as the isolation layer 25, that is, a silicon layer, the surfaces of the SN contact plugs 23 exposed during the surface treatment 101 are oxidized by a certain thickness to form an oxide layer 23A.

An etching process 102 is performed to expand the CD of the open regions 26 by removing the surface-treated areas. The surface-treated areas indicate the oxide layers 25A and 23A formed on the surfaces of the isolation layer 25 and the SN contact plugs 23, respectively, through the surface treatment 101. The above-described etching process 102 may expand the open regions 26 in horizontal and vertical directions. Hereafter, the expanded open regions 26 are represented by reference numeral 26A.

The etching process 102 may be performed at the same time as a cleaning process for removing byproducts generated during the formation of the open regions 26A. That is, the etching process 102 for expanding the CD of the open regions 26 by removing the surface-treated areas may be performed separately or performed by the cleaning process which is typically performed.

The etching process 102 for expanding the CD of the areas 26 may be performed by using a wet cleaning process to prevent a load or damage applied to the formed structure. At this time, a buffered oxide etchant or HF solution may be used as a cleaning solution. This is because, as the surface treatment 101 is performed by using the oxidation process, the oxide layers 25A and 23A are formed as the surface-treated layers. The cleaning solution may be controlled depending on the type of the surface-treated layers.

Through the above-described surface treatment 101 and etching process 102, it can stably increase the CD of the open regions 26A. In the exemplary embodiment of the present invention, the isolation layer 25 is formed of a semiconductor layer, the surface treatment 101 is performed, and the etching process 102 for removing the surface-treated areas is then performed. Therefore, the CD of the open regions 26A can be uniformly increased. Accordingly, it can prevent concerns from occurring while the isolation layer 25A at the side of the open regions 26A is additionally etched through an etching process such as dry etching or wet etching to increase the CD of the open regions 26A.

Figure 2E:
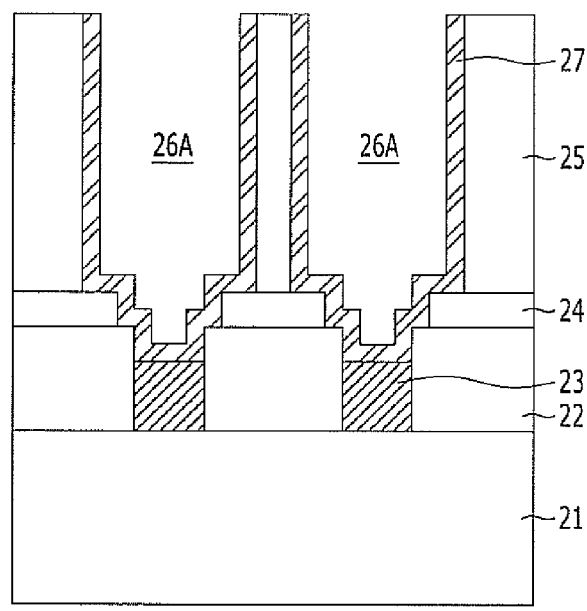

Referring to FIG. 2E, an SN conductive layer is deposited along the surface of the structure including the open regions 16A, and an SN isolation process is performed to form an SN 27 in each of the open regions 26A.

Although not illustrated, an ohmic contact layer may be formed on the SN contact plug 23, before the SN 27 is formed. The ohmic contact layer is formed to reduce the contact resistance between the SN 27 and the SN contact plug 23. At this time, the ohmic contact layer may be formed of a metal silicide layer.

Figure 2F:
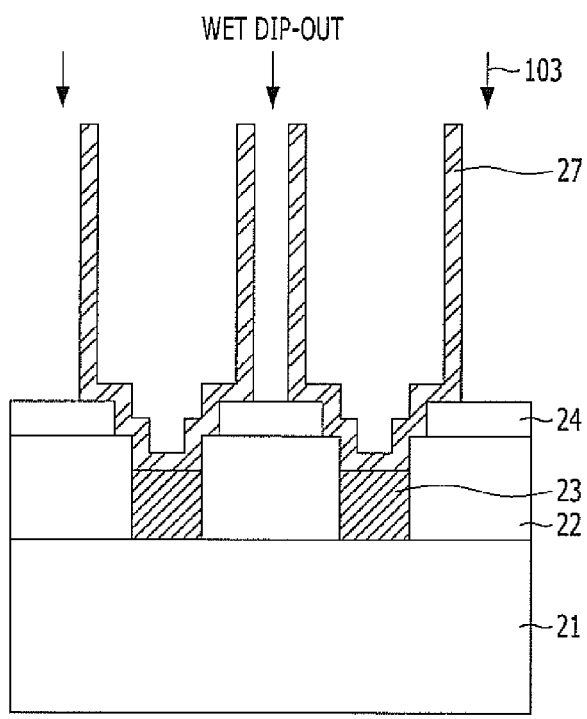

Referring to FIG. 2F, a wet dip-out process 103 is performed to remove the remaining isolation layer 25 such that the outer sidewalls of the SN 27 are exposed. At this time, the etching stop layer 24 serves to prevent the SN 27 from collapsing during the wet dip-out process 103 and support the SN 27 during a subsequent process.

Furthermore, when the SN contact plug 23 is formed of the same material as the isolation layer 25, the SN contact plug 23 may be recessed by a predetermined thickness by the surface treatment 101 and the cleaning process 102. Therefore, since the lower part of the SN 27 is stuck in the interlayer dielectric layer 22, this structure can more effectively prevent the SN 27 from collapsing during the wet dip-out process 103. Furthermore, the SN 27 can be more effectively supported during a subsequent process.

For reference, the SN contact plug 23 may be over-etched and recessed by a certain thickness during the wet dip-out process 100 in order to support the SN 27. In this case, it is difficult to uniformly control an etching amount across the entire substrate 21. However, the surface treatment 101 in accordance with the embodiment of the present invention is performed only by a certain thickness from the exposed surface. Therefore, the surface of the SN contact plug 23 may be converted into the oxide layer 23A having a uniform thickness across the entire substrate 21. Accordingly, the SN contact plug 23 may be recessed by a uniform thickness across the entire substrate 21.

Although not illustrated, a dielectric layer and a plate electrode layer may be sequentially formed to complete a capacitor of the semiconductor device.

FIGS. 3A to 3D are cross-sectional views illustrating a method for fabricating a semiconductor device in accordance with another embodiment of the present invention. The method of FIGS. 3A to 3D in accordance with the embodiment of the present invention may be applied to a process for forming a metal contact plug having a high aspect ratio, for example, M1C.

Figure 3A:
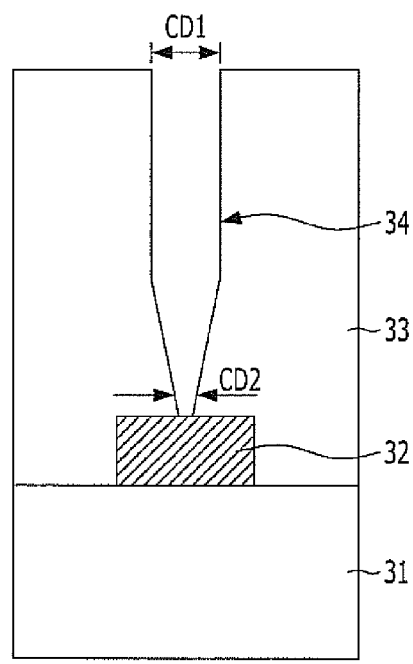
FIGS. 3A to 3D are cross-sectional views illustrating a method for fabricating a semiconductor device in accordance with another exemplary embodiment of the present invention.

Referring to FIG. 3A, a conductive layer 32 is formed on a substrate 31. At this time, the conductive layer 32 may include a bit line.

An interlayer isolation layer 33 is formed on the substrate 31 so as to cover the conductive layer 32. At this time, the interlayer isolation layer 33 is formed of a certain material so that a layer having an etching selectivity with respect to the interlayer isolation layer 33 can be formed through a subsequent surface treatment. For example, the interlayer isolation layer 33 may be formed of a semiconductor layer, for example, a silicon layer. At this time, the interlayer isolation layer 33 may be formed of an amorphous silicon layer to reduce a load, such as a heat load, which is applied to the formed structure.

Although not illustrated, an insulation layer may be formed on the entire surface of the substrate 31 including the conductive layer 32, before the interlayer isolation layer 33 is formed.

A hard mask pattern (not shown) is formed on the interlayer isolation layer 33, and the interlayer isolation layer 33 is etched using the hard mask pattern as an etching barrier so as to form a metal-contact contact hole exposing the conductive layer 32. For convenience of description, the metal-contact contact hole is referred to as an open region 34.

The open region 34 having a high aspect ratio like the metal-contact contact hole is formed by a dry etching process. Due to the characteristic of the dry etching process, the etching efficiency decreases toward the lower part of the open region 34. Therefore, the top CD CD1 of the open region 34 is set to be larger than the bottom CD CD2 thereof. In particular, the bottom CD CD2 of the open region 34 may be set to be much smaller than a desired bottom CD CD2. Such a reduction in the bottom CD CD2 of the open region 34 may increase contact resistance. In some case, a contact-not-open phenomenon may occur to cause a failed semiconductor device.

Figure 3B:
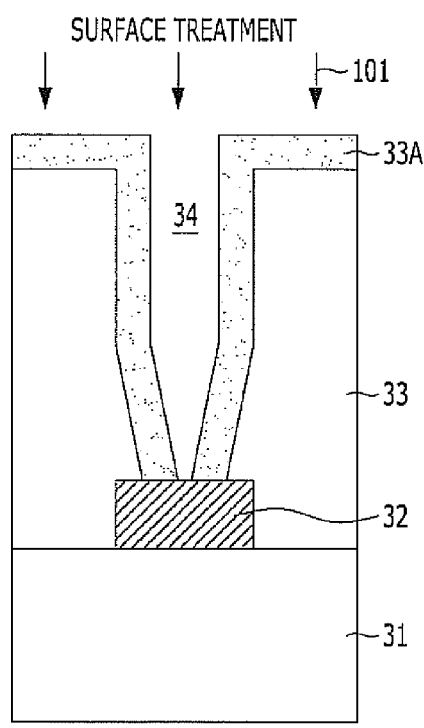

Referring to FIG. 3B, a surface treatment 101 is performed on the interlayer isolation layer 33 having the open region 34 formed therein. At this time, the surface treatment 101 may be performed by using any one process selected from the group consisting of oxidation, nitration, and oxynitrocarburising processes. Each of the oxidation, nitration, and oxynitrocarburising processes may be performed by using any one or more treatments selected from the group consisting of a thermal treatment, a plasma treatment, and a radical treatment.

As the above-described surface treatment 101 is performed, an insulation layer 33A having an etching selectivity with respect to the interlayer isolation layer 33 is formed by a certain thickness along the surface of the interlayer isolation layer 33 having the open region 34 formed therein. In other words, a portion of the interlayer isolation layer 33 is transformed into the insulation layer 33A by the surface treatment 101.

Figure 3C:
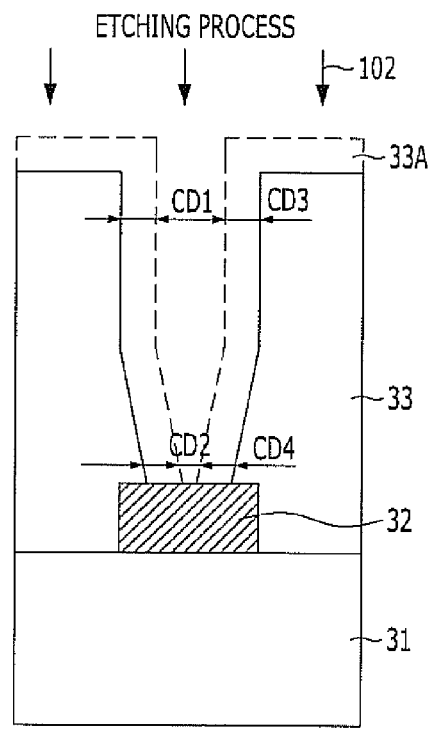

Referring to FIG. 3C, an etching process 102 for removing the insulation layer 33A is performed to expand the CD of the open region 34. The above-described etching process 102 may increase the bottom CD CD2 of the open region 34 by the thickness of the insulation layer 33A formed during the surface treatment 101. Hereafter, the expanded open region 34 is represented by reference numeral 34A.

The etching process 102 may be performed at the same time as a cleaning process for removing byproducts which are generated during the process for forming the open region 34A. That is, the etching process 102 may be performed separately or performed by using the cleaning process which is typically performed. The etching process 102 for expanding the CD of the open region 34 may be performed by using a wet cleaning process to prevent a load or damage applied to the formed structure.

Using the above-described surface treatment 101 and etching process, it the bottom CD of the open region 34 can be stably increased. Accordingly, an increase of contact resistance caused by the reduction of the bottom CD may be substantially prevented. Furthermore, a contact fail of a semiconductor device caused by a contact-not-open phenomenon may be prevented/reduced.

Figure 3D:
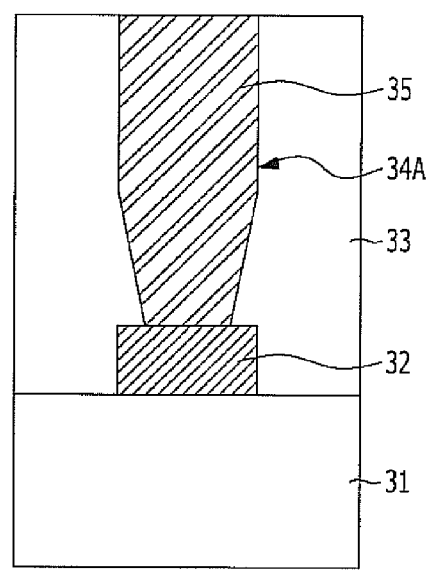

Referring to FIG. 3D, a conductive material is buried in the open region 34A to form a contact plug 35. At this time, the contact plug 35 includes a metal-contact plug, for example, M1C.

Although not illustrated, an insulation layer may be formed on the sidewalls of the open region 34 and the upper surface of the interlayer isolation layer 33, before the contact plug 35 is formed.

In accordance with the exemplary embodiments of the present invention, the CD of the open regions can be stably increased through the surface treatment. Furthermore, the CD of the open regions can is be uniformly increased across the entire substrate.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor layer, comprising:
    forming an interlayer dielectric layer having a plurality of storage node contact plugs;
    forming an isolation layer over the interlayer dielectric layer;
    forming a plurality of open regions exposing the respective storage node contact plugs by selectively etching the isolation layer;
    performing a surface treatment over the isolation layer and the exposed storage node contact plugs;
    expanding the open regions by removing the surface-treated portion of the isolation layer and the exposed storage node contact plugs;
    forming a storage node in each of the expanded open regions; and
    removing the isolation layer,
    wherein the performing the surface treatment uses any one process selected from the group consisting of nitration and oxynitrocarburising processes.

2. The method of claim 1, wherein the performing the surface treatment uses any one or more treatments selected from the group consisting of a thermal treatment, a plasma treatment, and a radical treatment.

3. The method of claim 1, wherein the surface-treated portion of the isolation layer is formed of a certain material so that the surface-treated portion of the isolation layer has an etching selectivity with respect to the isolation layer.

4. The method of claim 1, wherein the isolation layer is formed of any one material selected from the group consisting of Si, Ge, and SiGe.

5. The method of claim 1, wherein the isolation layer has a polycrystalline phase or amorphous phase.

6. The method of claim 1, wherein the storage node contact plugs are formed of the same material as the isolation layer.

7. The method of claim 1, wherein the expanding of the open regions is performed by using a wet etching process.

8. The method of claim 6, wherein the storage node contact plugs are recessed while expanding the open regions.

9. The method of claim 8, wherein the storage node has a structure to be stuck in the interlayer dielectric layer.

* * * * *